United States Patent [19]

Miura

[11] 4,002,930
[45] Jan. 11, 1977

[54] PHASE SWITCHING CIRCUIT
[75] Inventor: Hideki Miura, Tokyo, Japan
[73] Assignee: Sony Corporation, Tokyo, Japan
[22] Filed: Apr. 25, 1975
[21] Appl. No.: 571,750
[30] Foreign Application Priority Data
  July 23, 1974  Japan .............................. 49-87515
[52] U.S. Cl. .............................. 307/262; 307/232;
   307/249; 307/295; 307/247 R; 307/303
[51] Int. Cl.² .................. H03K 17/60; H03K 3/286
[58] Field of Search .......... 307/232, 295, 262, 249,
   307/247; 358/17, 18, 19, 20, 24

[56] References Cited
   UNITED STATES PATENTS

| | | |
|---|---|---|
| 2,991,375 | 7/1961 | Abraham et al. .............. 307/295 X |
| 3,348,145 | 10/1967 | Erath .............................. 307/232 X |
| 3,534,156 | 10/1970 | Henze .................................. 358/18 |
| 3,794,754 | 2/1974 | Haferl .................................. 358/18 |

*Primary Examiner*—John S. Heyman
*Attorney, Agent, or Firm*—Hill, Gross, Simpson, Van Santen, Steadman, Chiara & Simpson

[57] ABSTRACT

A phase switching circuit utilizing a novel bidirectional transistor having a signal applied to its base and a flip-flop circuit arrangement coupled to its output terminals which may be referred to as either collector or emitter depending upon the operation state of the circuit. The flip-flop circuit has a pair of transistors which act as switches and which are respectively coupled in series with the output terminals of the bidirectional transistor. When each of the flip-flop transistors is conducting, a power supply signal is conducted in opposite directions through the bidirectional transistor depending upon which of the transistors is in the on and which is in the off state. Essentially, the switching action of the flip-flop circuit converts the operation of the bidirectional transistor between emitter follower and collector follower configurations, hence the output signal is shifted from a signal which is in phase with the input signal to a signal which is out of phase with that input signal.

6 Claims, 6 Drawing Figures

PHASE SWITCHING CIRCUIT

BACKGROUND OF THE INVENTION

1. Description of the Prior Art

Prior phase switching circuits have utilized flip-flop circuits to switch on and off respective diodes which are in turn coupled to emitter and collector terminals of a standard transistor. The input signal being switched is applied to the base of such a transistor and depending upon which output diode is in the conducting state, either a signal in phase with the input signal or a signal which is out of phase with that signal is supplied to an output.

2. Field of the Invention

The field of art to which this invention pertains is phase switching circuits and in particular to circuits for switching the phase of an input signal from a first phase to an opposite polarity by the use of a trigger signal such as a flip-flop signal.

SUMMARY OF THE INVENTION

It is an important feature of the present invention to provide an improved circuit for switching the phase of an input signal from a first phase to a phase of opposite polarity.

It is another feature of the present invention to accomplish the above phase switching arrangement with a novel bidirectional and transistor.

It is a principal object of the present invention to provide a novel phase switching circuit which has improved simiplicity in circuit construction and reduced cost.

It is an additional object of the present invention to provide a phase switching circuit arrangement of the type described above using a novel bidirectional transistor and employing first and second switching means connected in series with the output terminals of the bidirectional transistor for the purpose of switching that transistor between an emitter follower operation state to a collector follower operation state whereby a phase varying output signal can be obtained in accordance with the timing of an input trigger signal.

These and other objects, features and advantages of the present invention will be understood in greater detail from the following description and associated drawings wherein reference numerals are utilized to designate a preferred embodiment.

DESCRIPTION OF THE PREFERRED EMBODIMENTS

This invention relates generally to phase switching circuits, and more particularly to circuits for deriving therefrom a signal, which corresponds to an input supplied thereto, with the original phase and with an inverted phase in accordance with a predetermined control signal.

A phase switching circuit for obtaining from an input signal an output signal which has the original phase and an inverted phase alternately for predetermined repeated durations is required for some purposes. For example, in a PAL color television receiver, such a circuit is used as a phase switching circuit for inverting the phase of the chrominance signal representing an R—Y color difference signal component or a phase of a reference carrier signal used for demodulating the R—Y color difference signal component for every other line period and obtaining continuously the chrominance signal or the reference carrier signal with the original phase and the inverted phase alternately every line period.

The present invention provides a phase switching circuit which has a novel and improved circuit arrangement formed with use of a novel semiconductor device superior in bidirectional conductivity and is suitable for a phase switching circuit used in the chrominance signal circuit portion of a PAL color television receiver.

The phase control circuit according to the present invention comprises the novel semiconductor device acting as a bidirectionally conductive transistor having an emitter, a base and a collector and supplied with an input signal to one electrode corresponding to the base and a flip-flop circuit provided with a pair of output terminals connected to other two electrodes corresponding to the emitter and collector of the novel semiconductor device, respectively. The flip-flop circuit is operated by a control pulse signal to supply an operating D.C. voltage from a voltage source to the novel semiconductor device with polarity reversed in a predetermined repetition in accordance with the control pulse signal. An output signal having the phase identical with the input signal and the inverted phase in the predetermined repetition is derived from the electrode corresponding to the emitter or the collector of the novel semiconductor device.

Figure 1:
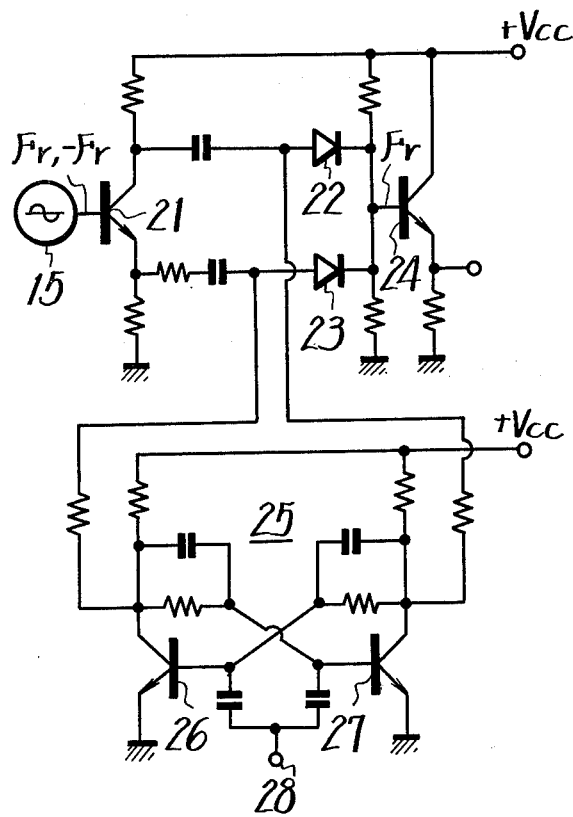
FIG. 1 as shows a prior art phase switching arrangement utilizing a flip-flop circuit and a pair of diodes as a means for switching the operation of a transistor from a first to a second opposing phase.

Referring to FIG. 1, an input transistor 21 has a signal source 15 applied to its base and has a pair of diodes 22 and 23 coupled to the collector and emitter terminals of the transistor, respectively. An output transistor 24 is shown as having its base coupled at a point between the diodes 22 and 23.

A flip-flop circuit 25 has a pair of switching transistors 26 and 27 and a trigger input terminal 28. The flip-flop circuit raises the voltage of the anodes of the respective diodes 22 and 23 when the respective transistors 27 and 26 are turned off. In this way, an output signal appearing at the base of the transistor 24 is either in phase with the input signal 15 or out of phase therewith.

Figure 2:
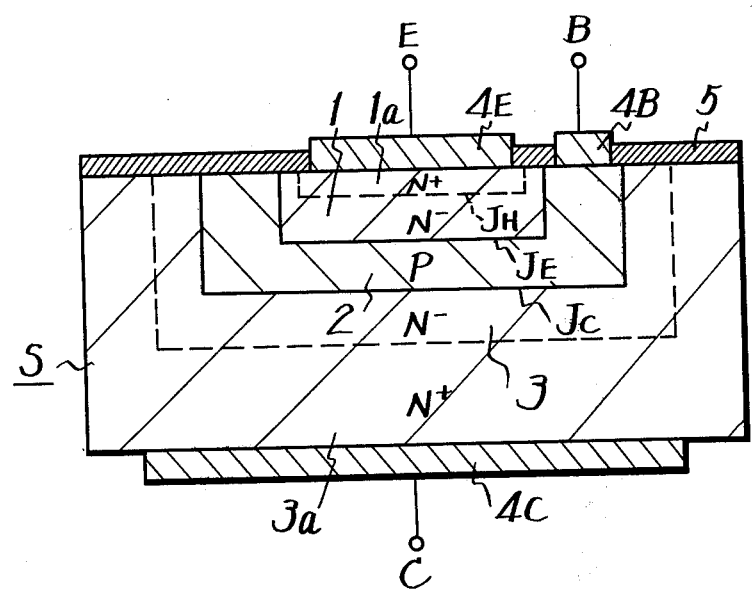
FIGS. 2 and 3 show detailed drawings of a novel semi-conductor device used in the circuit arrangement of the present invention as shown in FIG. 4.
Figure 3:
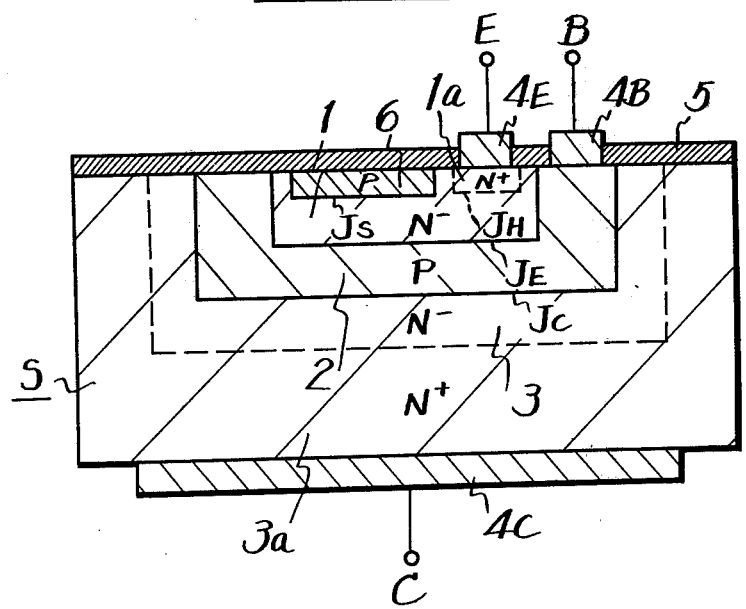

Referring to FIGS. 2 and 3, these Figures show a novel semiconductor device which is used in the invention as described in connection with FIGS. 4, 5a and 5b.

Before describing the present invention, an embodiment of the novel semiconductor device useable in the invention will be now described.

The emitter-grounded current amplification factor $h_{FE}$ of a transistor, which is one of parameters evaluating the characteristics of the bipolar transistor, can be expressed by the following equation (1), if the base-grounded current amplification factor of the transistor is taken as $\alpha$.

$$h_{FE} = \alpha/1 - \alpha \qquad (1)$$

The factor $\alpha$ is expressed as follows:
$$\alpha = \alpha^* \beta \gamma \qquad (2)$$
where $\alpha^*$ represents the collector amplification factor, $\beta$ the base transfer efficiency and $\gamma$ the emitter injection efficiency, respectively.

Now, if the emitter injection efficiency $\gamma$ of an NPN-type is taken into consideration, $\gamma$ is given by the following expression (3).

$$\gamma = \frac{J_n}{J_n + J_p} = \frac{1}{1 + \frac{J_p}{J_n}} \qquad (3)$$

where $J_n$ represents the current density of electrons injected from the emitter to the base of the transistor and $J_p$ the current density of holes injected from the base to the emitter of the transistor, respectively.

Since $J_n$ and $J_p$ are expressed by the following equations (4) and (5), respectively, $$J_n = \frac{qD_n n_p}{L_n} \left\{ \exp\left(\frac{qV}{kT}\right) - 1 \right\} \qquad (4)$$

$$J_p = \frac{qD_p p_n}{L_p} \left\{ \exp\left(\frac{qV}{kT}\right) - 1 \right\} \qquad (5)$$

the ratio $\delta$ of $J_n$ and $J_p$ is expressed as follows:

$$\delta = \frac{J_p}{J_n} = \frac{L_n}{L_p} \cdot \frac{D_p}{D_n} \cdot \frac{p_n}{n_p} \qquad (6)$$

where $L_n$ represents the diffusion distance of the minority carriers in the base of the transistor; $L_p$ the diffusion distance of the minority carriers in the emitter of the transistor; $D_n$ the diffusion constant of the minority carriers in the base; $D_p$ the diffusion constant of the minority carriers in the base; $n_p$ the concentration of the minority carriers in the base under the equilibrium state; $p_n$ the concentration of the minority carriers in the emitter under the equilibrium state; V a voltage applied to the emitter junction of the transistor; $k$ the Boltzmann's constant; T temperature and $q$ the absolute value of electron charge.

If it is assumed that the impurity concentration in the emitter of the transistor is taken as $N_D$ and that in the base of the transistor taken an $N_A$, the term pn/np can be replaced by the term $N_A/N_D$. Further, since $L_n$ is restricted by the base width W and $L_n = W$, the ration $\gamma$ is expressed as follows:

$$\delta = \frac{W}{L_p} \cdot \frac{D_p}{D_n} \cdot \frac{N_A}{N_D} \qquad (7)$$

The diffusion constants $D_n$ and $D_p$ are functions of transfer of the carrier and temperature, and in this case they are assumed constant substantially.

As may be obvious from the above respective equations, in order to increase the current amplification factor $h_{FE}$ of a transistor, it is sufficient to make the ratio $\gamma$ small.

Therefore, in an ordinary transistor, the impurity concentration $N_D$ of its emitter is selected high enough so as to make the ratio $\gamma$ small.

However, if the impurity concentration of the emitter is selected sufficiently high, for example, more than $10^{19}$ atom/cm$^3$, lattice defects and dislocation occur in the crystal of the semiconductor body of the transistor to deteriorate the crystal. Further, due to the fact that the impurity concentration of the emitter itself is high, a life time $\tau_p$ of the minority carriers injected to the emitter from the base becomes short.

Since the diffusion distance $L_p$ is expressed by the following equation (8)

$$L_p = \sqrt{D_p \tau_p} \qquad (8)$$

the diffusion distance $L_p$ of the minority carriers or holes becomes short. Therefore, as may be apparent from the equation (7), $\delta$ cannot be made small so much and hence the injection efficiency $\gamma$ cannot be made high over a certain value. As a result, the current amplification factor $h_{FE}$ cannot be made high so much in the ordinary transistor.

As mentioned previously, the novel semiconductor device useable in this invention is free from the defects mentioned just above inherent to the prior art transistor. As the semiconductor device used in this invention, an NPN-type one and a PNP-type one could be considered as in the case of the prior art transistor, but an NPN-type semiconductor device useable in this invention will be now described with reference to FIGS. 2 and 3, by way of example.

As shown in FIG. 2, the NPN-type semiconductor device consists of a first semiconductor region 1 of N$^-$ type conductivity formed in a semiconductor substrate S of N$^+$ type conductivity, a second semiconductor region 2 of P type conductivity formed in the semiconductor substrate S adjacent the first region 1, and a third semiconductor region $e$ of N$^-$ type conductivity formed in the substrate S adjacent the second region 2 to form a first PN-junction $J_E$ between the first and second regions 1 and 2 and a second PN-junction $J_c$ between the second and third regions 2 and 3, respectively.

With the semiconductor device useable in this invention and shown in FIG. 2, at the position facing the first junction $J_E$ and apart from it by a distance smaller than the diffusion distance $L_p$ of the minority carriers or holes injected from the second region 2 to the first region 1, a potential barrier having energy higher than that of the minority carriers or holes, or at least heat energy is formed in the first region 1. In the example of FIG. 2, the impurity concentration in the first region 1 is selected low of such as in the order of $10^{15}$ atoms/cm$^3$ and region 1a of N$^+$ type conductivity or the impurity concentration of about $10^{19}$ atom/cm$^3$ is formed in the first region 1 to form an LH-junction and hence to form the barrier.

The impurity concentration in the second region 2 is selected in the order of $10^{15}-10^{17}$ atom/cm$^3$ and that in the third region 3 is selected sufficiently low such as in the order of $10^{15}$ atom/cm$^3$.

In the semiconductor substrate S adjacent to the third region 3 but apart from the second juction $J_c$, there is formed a region 3a of N$^+$ type conductivity and with the impurity concentration of about $10^{19}$ atom/cm$^3$.

A first electrode 4E is formed on the high impurity concentration region 1a in the region 1 in ohmic contact therewith; a second electrode 4B is formed on the second region 2 in ohmic contact therewith; and a third electrode 4C on the high impurity concentration region 3a adjacent the third region 3 in ohmic contact therewith, respectively. From these electrodes 4E, 4B and 4C there are led out first, second and third terminals E, B and C, respectively. In FIG. 2, reference numeral 5 indicates an insulating layer made of, for example, SiO$_2$ and formed on the surface of the substrate S.

The semiconductor device shown in FIG. 2 can be used as a transistor. In such a case, the first region 1 serves as an emitter region; the second region 2 as a base region; and the third region 3 as a collector region, respectively, a forward bias is applied to the emitter junction $J_E$ and a reverse bias is applied to the collector junction $J_C$.

Thus, the holes injected from the base or the second region 2 to the emitter or first region 1 have a long life period of time due to the fact that the emitter region 1 has the low impurity concentration and good crystal property, and hence the diffusion distance $L_p$ of the holes in the emitter region 1 becomes long. As a result, as may be apparent from the equations (6) and (3), the emitter injection efficiency $\gamma$ can be made high. However, in the case that the diffusion distance $L_p$ is made long, if the injected holes into the emitter region 1 may arrive at the surface of the substrate S and may be recombined with electrons on the surface in practice, the diffusion distance $L_p$ could not be made long substantially. With the semiconductor device shown in FIG. 2, since the potential barrier is formed in the emitter region 1, which potential barrier faces the emitter junction $J_E$, at the position with a distance smaller than the diffusion distance $L_p$ of the minority carrier, the amount of the surface-recombination is reduced and the diffusion distance $L_p$ can be taken long sufficiently.

Due to the fact that the potential barrier is formed as described above in the example shown in FIG. 2, there is performed such an effect that the current density or component $J_p$ of the holes injected from the base region 2 to the emitter region 1 is reduced. That is, on the LH-junction $J_H$ in the emitter region 1, there is caused a false Fermi level difference or built-in electric field which acts to suppress the diffusion of the holes or the minority carrier. Therefore, if the level of the Fermi level is sufficiently high, the diffusion current caused by the concentration gradient of holes and the drift current caused by the built-in electric field are cancelled on the LH-junction with each other to reduce the hole current $J_p$ injected from the base 2 through the emitter region 1 of low impurity concentration. By this effect, the ratio of electron current arriving at the collector region 3 relative to current component passing through the emitter junction $J_E$ is increased and hence the emitter injection efficiency $\gamma$ is increased as apparent from the equation (3) to make the current amplification factor $h_{FE}$ high.

The above level difference (the height of the potential barrier) must be more than the energy of holes or at least the heat energy. The heat energy can be approximated as kT but the above level difference is desired to be more than 0.1 eV. With in the transistion region of the potential, the diffusion distance $L_p$ of the holes must be not terminated within the transition region, or it is required that the diffusion distance $L_p$ of the hole must be greater than the width of the transition region.

In the case that LH-junction $J_H$ is formed as shown in FIG. 2, the potential barrier of 0.2 eV can be formed by suitably selecting the amount of impurity and gradient of the high impurity concentration region 1a.

FIG. 3 shows another example of the semiconductor device useable with the invention in which reference numerals and letters same as those used in FIG. 2 indicate the same device so that their description will be omitted.

In the example of FIG. 3, in order to form a PN-junction $J_S$ facing the first or emitter junction $J_E$, an additional region 6 of P type conductivity is formed in the first region 1. In the example of FIG. 3, the distance between the junctions $J_S$ and $J_E$ is selected smaller than the diffusion distance $L_p$ of the minority carrier in the first region 1. The other construction of the example shown in FIG. 3 is substantially same as that of the example shown in FIG. 2.

With the example of FIG. 3, since the diffusion distance $L_p$ of the hole injected to the first region 1 is long as described above, the hole arrives at the additional region 6 effectively and then is absorbed thereby. When the additional region 6 is floated from electrical point of view, its potential is increased as the number of holes arriving at the additional region 6 is increased. Thus, the PN junction $J_S$ formed between the regions 6 and 1 is biased forwardly to its rising-up voltage substantially, and then holes will be re-injected to the first region 1 from the additional region 6. Thus, the concentration of holes in the first region 1 near the additional region 6 will be increased, and accordingly the concentration distribution of holes between the junctions $J_E$ and $J_S$ in the first region 1 is made uniform and the gradient thereof becomes gradual to reduce the diffusion current $J_p$ from the second region 2 to the first region 1.

In the example of FIG. 3, the additional region 6 which has the same conductivity type as that of the second region 2 is formed in the first region 1 separated from the second region 2, but it may be possible that the second region 6 is formed being continuously extended from the second region 2.

The above description is made on the case that the first, second and third regions 1, 2 and 3 of the semiconductor device are operated as emitter, base and collector, respectively. However, in the above semiconductor devices the impurity concentrations of the first and third regions 1 and 3 surrounding the second region 2 are selected low of about equal order and they are arranged symmetrically with respect to the second region 2, so that if the first, second and third regions 1, 2 and 3 are acted as, collector, base and emitter, respectively, the semiconductor devices can be operated as a transistor reverse in the operating direction to those mentioned previously.

When the symmetry of the semiconductor devices is utilized, the symmetry can be emphasized by forming in the third region 3a potential barrier facing the second junction $J_C$, surrounding the same and having the energy higher than that of the minority carrier or hole in the third region 3 as shown in FIGS. 2 and 3 by dotted lines outside the junction $J_C$. To this end, the region 3a of high impurity concentration in the third region 3 is so formed to surround the junction $J_C$ and the distance between the junction $J_C$ and the region 3a is selected smaller than the diffusion distance of the minority carrier or hole injected to the third region 3 at the respective parts.

The features of the novel semiconductor devices described above can be summarized as follows which will be apparent from the above description.

1. The current amplification factor $h_{FE}$ is high and can be increased more than 3000.
2. The current amplification factor $h_{FE}$ is uniform. That is, with a prior art transistor, the impurity concentration of the emitter region is selected sufficiently high so as to increase the emitter injection efficiency or the current amplification factor of the prior art transistor depends upon the difference of the impurity concentrations near the junction between the emitter and base regions, so that it is required to select the impurity concentrations in both the regions relatively. On the contrary, in the semiconductor devices for use with the invention, by forming the potential barrier in the emitter region 1 facing the emitter junction $J_E$, the current component of the minority carrier injected in the emitter region 1 is suppressed to increase the emitter injection efficiency, so that the mutual influence between the emitter and base regions 1 and 2 is small due to the fact that the emitter region 1 is selected relatively low in impurity concentration, and the width of the base region 2 and the distribution of impurity concentration therein can be selected as planned and hence $h_{FE}$ can be uniform as described above.
3. Since the affect by the surface recombination is avoided, the current amplification factor $h_{FE}$ can be made high even if the current is low.
4. The noise can be reduced. That is, since the main parts of the first and second junctions $J_E$ and $J_C$ are formed between the low impurity concentration regions of P and N conductivity types, crystal defects are small. Further, if the impurity concentration near the electrode 4B attached to the second region 2, by way of example, is selected high, a component of the emitter-base current, as the transistor, along the surface of the semiconductor substrate S can be reduced. Therefore, the noise of 1/f can be reduced. Further, the burst noise and noise of 1/f can be also reduced by the fact the $h_{FE}$ is high. In addition, if a base expansion resistance $\gamma_{bb}'$ is made small, the noise can be reduced even if the impedance of a signal source is low.
5. The current amplification factor $h_{FE}$ is good in temperature characteristics.
6. The semiconductor devices can be used as bidirectionally conductive transistors, respectively, and are excellent in symmetry.
7. Since the impurity concentration in the vicinity of the first and second junctions $J_E$ and $J_C$ is low, $BV_{BEO}$ (collector-opened base-emitter voltage) is high for both the forward and reverse directions of transistors.
8. When the semiconductor devices are used as a power transistor, their strength is high because their emission is made uniform by their distributed inner resistance in their emitter region.
9. Saturation characteristics are superior.
10. When the region 6, which carrier out injection or re-injection, is formed, the equivalent resistance of the base is made low.

The invention has the basis on the fact that the above novel semiconductor device has a body structure symmetrical with respect to the second region 2, and provides a novel circuit which is good in balance and small in number of elements used therein by employing the above novel semiconductor device.

Figure 4:
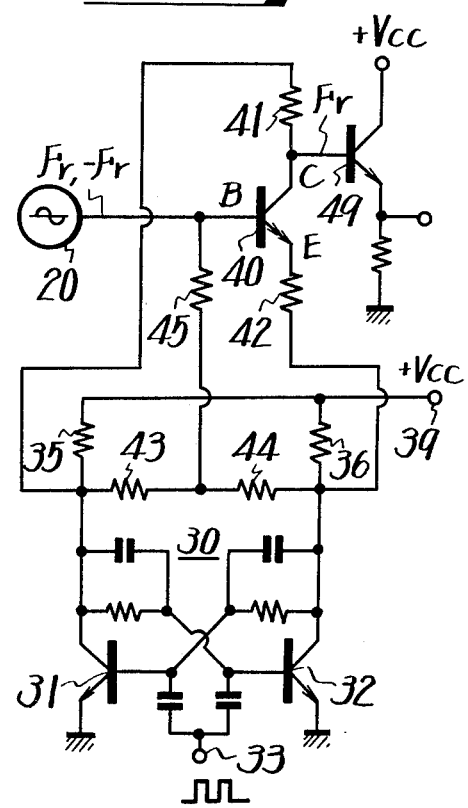
FIG. 4 is a schematic of a phase switching circuit according to the present invention utilizing a bidirectional transistor as shown in FIGS. 2 and 3 and having the operation of the bidirectional transistor controlled by a flip-flop circuit.
Figure 5A:
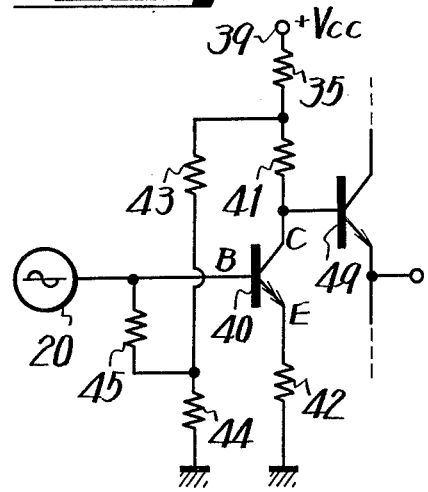
FIG. 5a is an equivalent circuit related to FIG. 4 which shows the collector follower operating state of FIG. 4 as determined by one state of the flip-flop circuit.
Figure 5B:
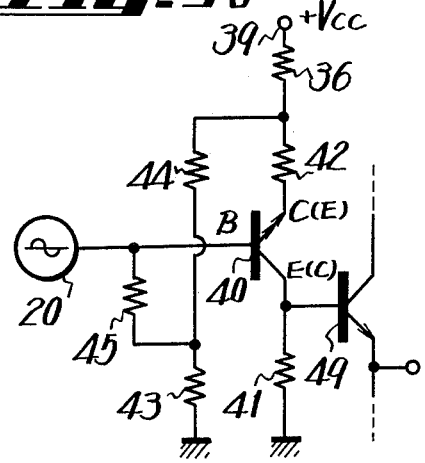
FIG. 5b is an equivalent circuit showing the emitter follower operating state of the circuit of FIG. 4 as determined by the opposite state of the flip-flop circuit.

Referring to FIG. 4 in connection with FIGS. 5 and 5b, an input signal 20 is applied to a base terminal which may be referred to as the second terminal of a bidirectional transistor 40. Transistor 40 has first and third terminal which may also be referred as emitter and collector terminals as shown. A transistor 49 has its base coupled to the collector terminal of the transistor 40 to receive therefrom the phase inverted and in phase signals.

A flip-flop circuit 30 has a pair of standard transistors 31 and 32 each of which can be seen to be coupled in a series path with the emitter and collector terminals of the bidirectional transistor 40. For instance, the transistor 32 has its emitter and collector coupled through a circuit line which includes the resistor 42, the emitter and collector of the bidirectional transistor 40, the resistor 41, a resistor 35 to a power supply at point 39. Also, the transistor 31 has its emitter and collector coupled through a circuit path which includes the resistor 41, the emitter-collector of the bidirectional transistor 40, the resistor 42, the resistor 36 and the power supply at point 39. Resistors 43, 44 and 45 provide biased for the base of the bidirectional transistor 40.

A pulse trigger signal is applied to an input terminal 33 of the flip-flop circuit to control the operation thereof and hence control the repetition rate at which the input signal 20 is shifted in phase at the output which happens to be the collector of the bidirection transistor 40.

When the transistor 31 is in the on state, the transistor 32 is off. By following this circuit this circuit arrangement of FIG. 4, it can be seen that a circuit operation is described as a collector follower system which is shown in FIG. 5a. Essentially, the collector of the transistor 40 is connected to a low voltage point which, in this case, is circuit ground through the conducting transistor 31. At the same time, the power supply is short circuited from being connected to the collector and is allowed to be connected to the emitter terminal. Hence, in this arrangement as shown in FIG. 5a, the output signal which is applied to the transistor 49 is in phase opposition to the input signal applied at the base of the bidirectional transistor.

The opposite is true when the transistor 32 is placed in the conducting state by the operation of the switching signal applied to the terminal 33. This arrangement is shown in FIG. 5b in which the emitter of the bidirectional transistor is essentially connected to circuit ground through the conducting state of the transistor 32. This corresponds to an emitter follower configuration which is displayed in FIG. 5b. The result is that the signal applied to the base of the transistor 49 is in phase with the signal applied to the base of the bidirectional transistor. Hence, according to the triggering operation of the flip-flop circuit, the output signal is either in phase or out of phase which is the result desired to be achieved by the present invention. This result is, however, here achieved in a simpler and more direct fashion by the use of a single device rather than three devices as is in the prior art.

I claim as my invention:

1. A phase switching circuit comprising:
 a bidirectional transistor having first, second and third terminals;
 a first circuit path connected to said first terminal;
 a second circuit path connected to said third terminal;
 an output means connected to said first circuit path;
 a power source having a relatively high voltage;
 first switching means for switching the first and third terminals of said bidirectional transistor between said power source and a low voltage circuit point for operation as an emitter follower;
 said first switching means being connected between a low voltage point and a point on the first circuit path;
 second swiching means for switching the first and third terminals of said bidirectional transistor between said power source and low voltage circuit point for operation as a collector follower;
 said second switching means being connected between a low voltage point and a point on the second circuit path;
 means for applying a time varying signal to said second terminal; and
 means for applying a signal means to control the sequence of said first and second switching means.

2. A phase switching circuit in accordance with claim 1, wherein said first and second switching circuit comprises a flip-flop circuit and wherein said means for applying a signal means to control the sequence of said first and second switching means comprises means for applying a trigger signal to said flip-flop circuit.

3. A phase switching circuit in accordance with claim 2, wherein said flip-flop circuit includes first and second transistors acting as said first and second switching means, the collector to emitter circuit of each of said transistors forming a series path with the first and third terminals of said bidirectional transistor, each of said switching transistors being arranged to conduct a signal in opposite directions through said bidirectional transistor and said switching transistors being connected to respective circuit branches which serve to supply said power source to terminals of said bidirectional transistor for short circuiting said branches during the conduction cycle of respective ones of said switching transistors.

4. A phase switching circuit comprising:
 a bidirectional transistor having
 a first semiconductor region of one conductivity type;
 a second semiconductor region of the opposite conductivity type adjacent said first region with a first semiconductor junction therebetween;
 a third semiconductor region of the same type as said first region adjacent said second region with a second semiconductor junction therebetween, said first region being associated with a potential barrier having energy higher than that of minority carriers injected from the second region to the first region, said barrier being provided at a position facing said first junction and spaced from the same by a distance smaller than the diffusion distance of the minority carriers;
 first, second and third terminals coupled to said first, second and third regions, respectively;
 a first circuit path connected to said first terminal;
 a second circuit path connected to said third terminal;
 an output means connected to said first circuit path;
 a power source having a relatively high voltage;
 first switching means for switching the first and third terminals of said bidirectional transistor between said power source and a low voltage circuit point for operation as an emitter follower;
 said first switching means being connected between a low voltage point and a point on the first circuit path;
 second switching means for switching the first and third terminals of said bidirectional transistor between said power source and low voltage circuit point for operation as a collector follower;
 said second switching means being connected between a low voltage point and a point on the second circuit path;
 means for applying a time varying signal to said second terminal; and
 means for applying a signal means to control the sequence of said first and second switching means.

5. A phase switching circuit in accordance with claim 4, wherein said first and third regions of the semiconductor device each have a first portion with an impurity concentration of substantially the same order of magnitude and said first region is provided therein with a second portion having an impurity concentration higher than said first portion of the first region at a position spaced from said first junction by a distance smaller than the diffusion distance of the minority carriers to establish said potential barrier.

6. A phase switching circuit in accordance with claim 4, wherein said first and third regions each have a first portion with an impurity concentration of substantially the same order of magnitude and an additional semiconductor region of the same type as said second region is provided in contact with said first region at a position spaced from said first junction by a distance smaller than the diffusion distance of the minority carriers to establish said potential barrier.

* * * * *